(12) United States Patent
Giatis et al.

(10) Patent No.: US 7,760,024 B2
(45) Date of Patent: Jul. 20, 2010

(54) SYSTEM AND METHOD FOR INCREASING ACCURACY OF TRANSMITTER POWER DETECTION OVER A LARGER RANGE OF OUTPUT POWER LEVELS

(75) Inventors: Petros Giatis, Brunswick, OH (US); Gerald B. Johnson, Hudson, OH (US); Franklin D. Simon, Jr., Wadsworth, OH (US); Corey Metsker, Clinton, OH (US)

(73) Assignee: Cisco Technology, Inc, San Jose, CA (US)

( * ) Notice: Subject to any disclaimer, the term of this patent is extended or adjusted under 35 U.S.C. 154(b) by 657 days.

(21) Appl. No.: 11/246,808

(22) Filed: Oct. 7, 2005

(65) Prior Publication Data
US 2007/0080748 A1 Apr. 12, 2007

(51) Int. Cl.
*H03G 3/00* (2006.01)
(52) U.S. Cl. .................. 330/278; 330/279; 330/285; 330/310
(58) Field of Classification Search .............. 330/278, 330/279, 285, 310
See application file for complete search history.

(56) References Cited

U.S. PATENT DOCUMENTS

| 6,404,283 | B1 | 6/2002 | Henry | |
| 6,522,197 | B2 * | 2/2003 | Nam et al. | 330/133 |
| 6,683,496 | B2 | 1/2004 | Poggi et al. | |
| 7,298,212 | B2 * | 11/2007 | Nodake | 330/279 |
| 7,358,818 | B2 * | 4/2008 | Uesaka et al. | 330/308 |
| 2003/0218501 | A1 | 11/2003 | Oshima et al. | |

FOREIGN PATENT DOCUMENTS

EP 0 413 311 2/1991

OTHER PUBLICATIONS

International Search Report dated Jul. 3, 2008, for International Application No. PCT/US 06/32435, filed on Aug. 21, 2006.
European Search Report dated Nov. 11, 2009, for European Application No. 06801904.1.

* cited by examiner

*Primary Examiner*—Michael B Shingleton

(57) ABSTRACT

A system and method for increasing accuracy of transmitter power detection over a larger range of output power levels wherein a diode detector is followed by a series cascade of 2 op amps. The first op amp functions as a differential/buffer amplifier, which improves temperature performance. The second op amp has two selectable gain factors. The output of the second op amp is routed to the ADC. A single control line is connected to a controllable switching device that configures the second op amp for high gain or low gain.

13 Claims, 4 Drawing Sheets

SYSTEM AND METHOD FOR INCREASING ACCURACY OF TRANSMITTER POWER DETECTION OVER A LARGER RANGE OF OUTPUT POWER LEVELS

BACKGROUND OF THE INVENTION

An Access Point (AP) can have two transceivers for wireless local area network (WLAN or wireless LAN) applications, such as in the 2.4 GHz and 5 Ghz frequency bands. Both transmitters use a microwave detector diode to sense radio output power. The diode's output voltage is amplified and applied to an analog to digital converter (ADC).

The ADC is part of the digital feedback control loop that is used for transmit automatic level control (ALC). The ALC adjusts the radio power to maintain a target output power at the transmit antenna port. For example, an AP target output power can range from 1 dBm to 20 dBm.

The detector diode circuit response is centered to fit the range of the output voltages inside the ADC window (0 V to 2 V). With 8 bits of ADC resolution, an 8 mV change is required to change the ADC by one digital value. When the ADC value changes, the digital feedback loop makes the appropriate correction to maintain the target output power level at the antenna port.

However, a problem arises because the detector diode response (output voltage vs. input power) is more sensitive (i.e. has a steeper slope) for high transmit output power compared to low transmit output power levels. For example, a typical response is illustrated in table 1. TABLE-US-00001 TABLE 1 Target Output Power Response Sensitivity (dBm) (mV/dB) -1 4 8 25 11 34 20 120.

TABLE 1

| Target Output Power (dBm) | Response Sensitivity (mV/dB) |
| --- | --- |
| -1 | 4 |
| 8 | 25 |
| 11 | 34 |
| 20 | 120 |

At -1 dBm target output power, the ADC changes by 1 count when the power drifts by 2 dB. Then the digital feedback loop makes a correction. The -1 dBm transmit ALC accuracy is coarse (2 dB) because the receiver sensitivity is low (4 mV/dBm). Table 2 shows transmit ALC accuracy at various target output power levels, which is also graphically illustrated in FIG. 6, line 602.

TABLE 2

| Target Output Power (dBm) | ALC Accuracy (dB) |
| --- | --- |
| -1 | 2.00 |
| 8 | 0.32 |
| 11 | 0.24 |
| 20 | 0.07 |

Therefore, the nonlinear response of the diode sensor in the digital control loop reduces transmit power precision at low output power levels. The accuracy is much better at high target output power levels. However, applications such as radio management and high density (pico cells) require more accuracy at low transmit power levels.

An attempted solution to this problem used a detector diode followed by a total of three operational amplifiers (op amp) and two analog SPDT switches (see U.S. application Ser. No. 10/966,902 filed Nov. 23, 2004 and assigned to Cisco Technology, Inc., the assignee of this application). This first op amp functioned as a differential/buffer amplifier stage. The first SPDT switch was used to route the buffered DC voltage through one of two separate parallel op amp gain paths. One op amp was set for a fixed high gain factor. The other op amp was set for a fixed low gain factor. The second SPDT switch selected the high or low gain output and routed the voltage to the ADC. However, this approach required a lot of extra circuitry, which increased cost. Furthermore, substantial printed circuit board (PCB) real estate was required to implement this solution as well as multiple control line routing.

BRIEF SUMMARY OF THE INVENTION

In accordance with an aspect of the present invention, there is described herein a system wherein a diode detector is followed by a series cascade of 2 op amps. The first op amp functions as a differential/buffer amplifier, which improves temperature performance. The second op amp has two selectable gain factors. The output of the second op amp is routed to the ADC. A single control line is connected to a controllable switching device that configures the second op amp for high gain or low gain.

In accordance with an aspect of the present invention, there is disclosed herein a circuit. The circuit comprising a first amplifier comprising an input and an output and a second amplifier comprising an input and an output, the input coupled to the output of the first amplifier. A gain adjustment circuit is coupled to the second amplifier and is operable to configure the second amplifier to operate in one of a low gain state and a high gain state.

In accordance with an aspect of the present invention, there is disclosed herein a circuit for increasing accuracy of transmitter power detection over a larger range of output power levels. The circuit comprises a detector comprising first and second diodes in parallel, the first diode biased at a first bias level and the second diode biased at a second bias level and operative to receive a signal to be amplified. The circuit has a first operational amplifier comprising first and second inputs and an output, the first input coupled to the first diode and the second input coupled to the second diode. The circuit further comprises a second operational amplifier comprising first and second inputs and an output, the first input coupled to the output of the first operational amplifier. A feedback resistance is coupled from the output of the first operational amplifier to the second input of the operational amplifier. A first and a second resistance are coupled in series between the second input of the operational amplifier and a constant voltage (e.g. a bias voltage or ground). A controllable switching device is coupled in parallel to the second resistance, wherein the controllable switching device is operable in an on state and an off state. The controllable switching device is a short circuit across the second resistance in the on state and the controllable switching device is an open circuit across the second resistance in the off state.

In accordance with an aspect of the present invention, there is described herein a circuit, comprising a first means for amplifying having an input and an output and a second means for amplifying having an input and an output, the input of the second means for amplifying coupled in series to the output of the first means for amplifying. The circuit further comprises a means for selecting gain coupled to the second means for amplifying for selecting one of a low gain mode and a high gain mode for the second means for amplifying.

In accordance with an aspect of the present invention, there is disclosed herein a method for increasing the accuracy of power detection. A signal having a signal strength is received. The received signal is amplified by a first amplifier. The gain of a second amplifier is adjusted based on the signal strength of the received signal. The amplified signal is amplified a second time by a second amplifier.

An aspect of the present invention is that it solves the problem inaccurate control of low target transmit output powers while still maintaining accuracy at higher power levels. The present invention has a minimal impact to cost, circuit complexity, and required PCB real estate when compared to prior art techniques.

Still other objects of the present invention will become readily apparent to those skilled in this art from the following description wherein there is shown and described a preferred embodiment of this invention, simply by way of illustration of one of the best modes best suited for to carry out the invention. As it will be realized, the invention is capable of other different embodiments and its several details are capable of modifications in various obvious aspects all without departing from the invention. Accordingly, the drawing and descriptions will be regarded as illustrative in nature and not as restrictive.

BRIEF DESCRIPTION OF THE SEVERAL VIEWS OF THE DRAWING

The accompanying drawings incorporated in and forming a part of the specification, illustrates several aspects of the present invention, and together with the description serve to explain the principles of the invention.

DETAILED DESCRIPTION OF INVENTION

Throughout this description, the preferred embodiment and examples shown should be considered as exemplars, rather than limitations, of the present invention. An aspect of the present contemplates a system for increasing the accuracy of power detection over a larger range of output power levels wherein a diode detector is followed by a series cascade of 2 op amps. The first op amp functions as a differential/buffer amplifier, which improves temperature performance. The second op amp has two selectable gain factors. The output of the second op amp is routed to the ADC. A single control line is connected to a controllable switching device that configures the second op amp for high gain or low gain.

For high target output power levels, the second op amp is configured for low gain. For low target output power levels, the second op amp is configured for high gain. High gain increases the sensitivity of the diode detector circuit response, which improves the accuracy of the transmit ALC. In each gain case, the diode detector DC output voltage range was scaled to fit inside the ALC window (0 V to 2 V). In addition, the dynamic circuit response has been optimized for both low gain and high gain settings.

Table 3 shows the response sensitivity and consequent ALC accuracy at various target output power levels.

TABLE 3

| Target Output Power (dBm) | Op Amp Gain | Response Sensitivity (mv/dB) | ALC Accuracy (dB) |
| --- | --- | --- | --- |
| −1 | High | 23 | 0.35 |
| 8 | High | 118 | 0.07 |
| 11 | Low | 34 | 0.24 |
| 20 | Low | 120 | 0.07 |

Therefore, an aspect of the present invention is improved transmit ALC accuracy at low target power levels such as −1 dBm and 8 dBm. Another aspect of the present invention is that the series cascade approach uses very little circuitry, which minimizes the impact on cost and required PCB real estate when compared with prior art approaches. Another aspect of the present invention is that a single digital control line can be used to select the high/low gain factor as opposed to multiple control lines used in prior art solutions.

Figure 1:
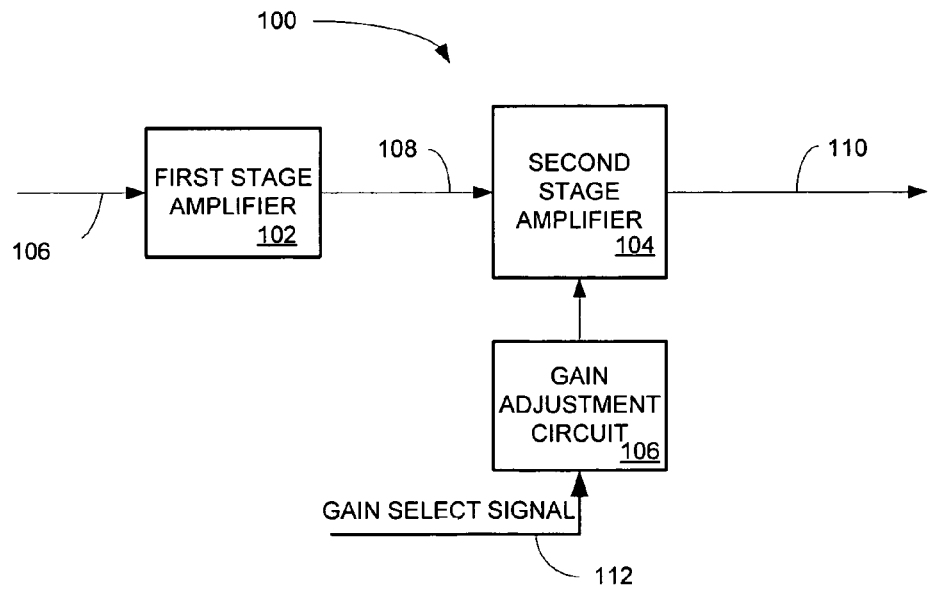
FIG. 1 is a block diagram of a circuit in accordance with an aspect of the present invention.

FIG. 1 is a block diagram of a circuit 100 in accordance with an aspect of the present invention. As illustrated in FIG. 1, a signal is coupled to an input 106 of first stage amplifier 102. Preferably first stage amplifier 102 is a unity gain buffer amplifier or an amplifier having a low gain, e.g. a range of 1-2. The amplified signal from first stage amplifier 102 is coupled to an input 108 of second stage amplifier 104. A gain adjustment circuit 106 is coupled to second stage amplifier 104 and is operative to adjust the gain of amplifier 104. Upon receiving a gain select signal on control line 112, gain adjustment circuit 106 sets second stage amplifier into a high gain mode or a low gain mode.

Logic can be employed for asserting gain select signal 112. The logic can determine whether the signal received at input 106 is above or below a predetermined threshold. For example, for transmitter power detection, gain select signal 112 can be coupled to logic that determines the desired output power level of the transmitter (not shown), thus enabling a digital signal, to set amplifier 104 in a high gain state (e.g. for output levels of −1 to 8 dBm) or a low gain state (e.g. for output levels 11-20 dBm). "Logic", as used herein, includes but is not limited to hardware, firmware, software and/or combinations of each to perform a function(s) or an action(s), and/or to cause a function or action from another component. For example, based on a desired application or need, logic may include a software controlled microprocessor, discrete logic such as an application specific integrated circuit (ASIC), a programmable/programmed logic device, memory device containing instructions, or the like, or combinational logic embodied in hardware. Logic may also be fully embodied as software.

Amplifier 104 amplifies the signal received from amplifier 102 via 106 at either the low gain setting or high gain setting. The twice amplified signal is then output from amplifier 104 at output 110.

In a preferred embodiment, the gain of amplifier 102 is approximately between 1 and 2, preferably 1. The low gain of amplifier 104 ranges from approximately 1-4, preferably 1.3. The high gain of amplifier 104 is greater 4-10, preferably 5.5. Approximately as used herein is defined having a tolerance of 20% or less.

Figure 2:
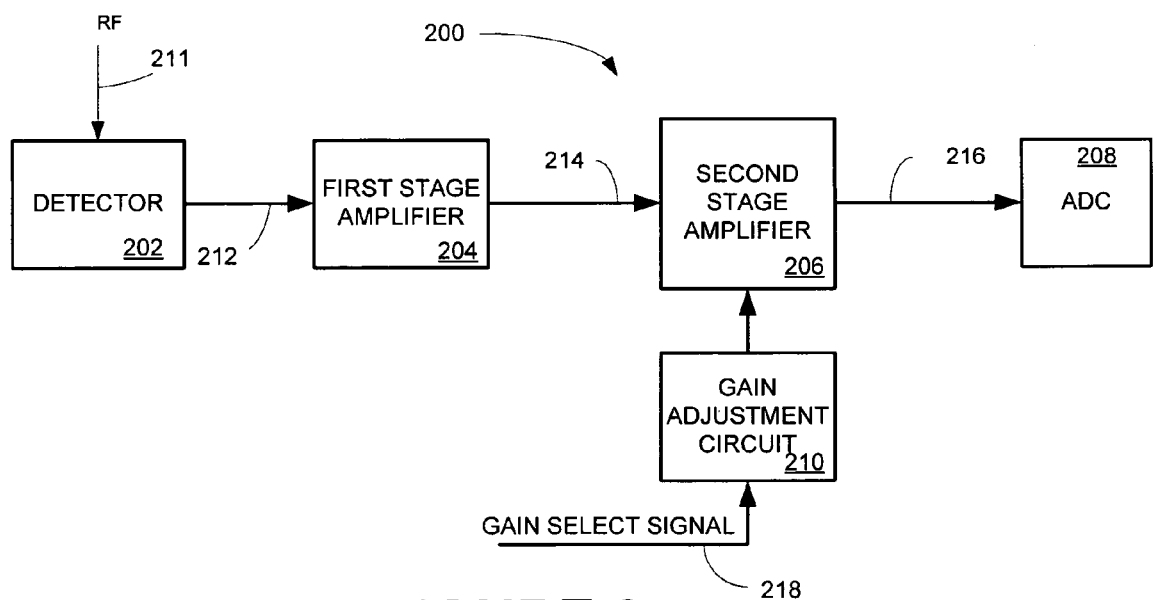
FIG. 2 is a block diagram of a power detection circuit in accordance with an aspect of the present invention.

FIG. 2 is a block diagram of a power detection circuit 200 in accordance with an aspect of the present invention. An RF signal is received by input 211 of detector 202. The signal from detector 202 is coupled to input 212 of first stage amplifier 204. Preferably first stage amplifier 204 is a unity gain buffer amplifier or an amplifier having a low gain, e.g. less than 2. The amplified signal from first stage amplifier 204 is coupled to input 214 of second stage amplifier 206. A gain adjustment circuit 210 is coupled to second stage amplifier 206 and is operative to adjust the gain of amplifier 206. Upon receiving a gain select signal on control line 218, gain adjustment circuit 210 sets second stage amplifier into a high gain mode or a low gain mode.

Logic can be employed for asserting gain select signal 218. The logic can determine whether the signal received at input 211 is above or below a predetermined threshold (e.g. 8 dBm or 11 dBm). For example, for transmitter power detection, gain select signal 218 can be coupled to logic that determines the desired output power level of the transmitter (not shown), thus enabling a digital signal to be gain select signal 218 to set amplifier 104 in a high gain state or a low gain state. For example, if the desired output level is below 8 dBm a signal is sent on gain select signal 218 to gain adjustment circuit 210 to set the amplifier in a high gain state; otherwise, the amplifier is set to a low gain state.

Amplifier 206 amplifies the signal received at input 214 a second time. The twice amplified signal is then output from amplifier 206 and coupled into input 216 of analog to digital controller (ADC) 208.

In a preferred embodiment, the gain of amplifier 204 is approximately between 1 and 2. The gain of amplifier 206 is in the low gain state is approximately between 104, preferably 1.3 The gain for amplifier 206 in the high state is approximately 4-10, preferably 5.5.

Figure 3:
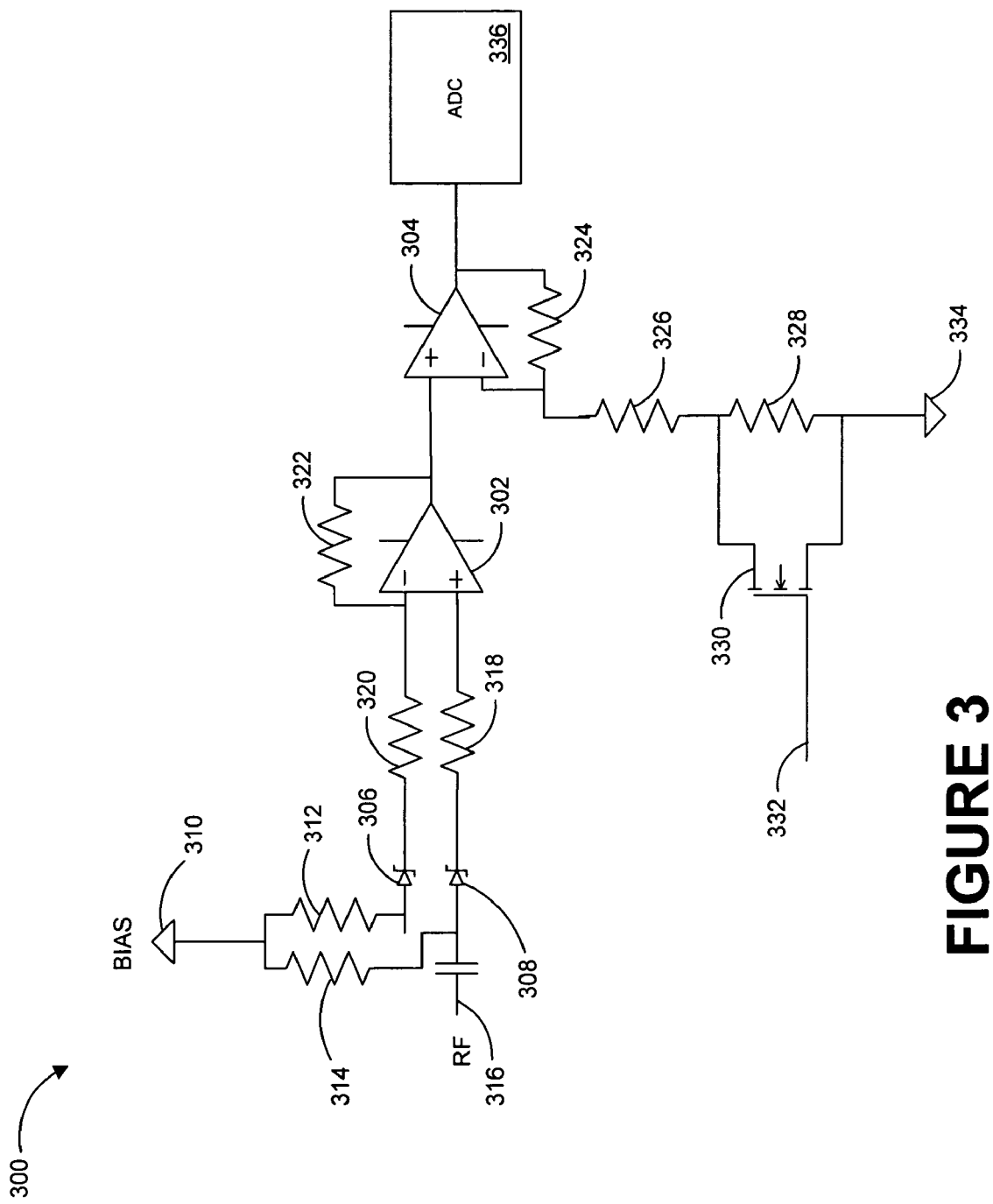
FIG. 3 is a schematic diagram of a circuit in accordance with an aspect of the present invention.

FIG. 3 is a schematic diagram of a circuit 300 in accordance with an aspect of the present invention. Circuit 300 is suitable to increasing accuracy of transmitter power detection over a large range of output power levels, or to linearize a non-linear response, such as the non-linear region of a diode response curve.

A first operational amplifier 302 is in series with a second operational amplifier 304. First amplifier 302 functions as a differential/buffer amplifier. Feedback resistor 322 is coupled between the output and an input (−) of amplifier 302.

The inputs of amplifier 302 are coupled to the outputs of diodes 306, 308 after passing through input resistors 320, 318 respectively. Diodes 306, 308 are biased by a bias source 310. Bias resistors 312, 314 are used to select the bias points for diodes 306, 308 respectively. Bias resistors 312 and 314 may be varied as needed to compensate for a single power supply providing power to amplifiers 302, 304 and bias 310.

The output of amplifier 302 is coupled into an input (+) of amplifier 304. Feedback resistor 324 is coupled between the output of amplifier 304 and a second input (−) of amplifier 304. The second input (−) of amplifier 304 is biased by source 334 that is coupled to the second input (−) by two resistors 326, 328. Source 334 can be any fixed voltage, including ground. A controllable switching device (e.g. is MOSFET) 330 is coupled across resistor 328. A control line 332 is coupled to the gate of MOSFET 330.

In operation, diode 306 is biased by source 310 (e.g. a DC voltage) through resistor 312 and diode 308 is biased by source 310 through resistor 314. A signal, such as an RF signal is received through capacitor 316 and passed to diode 308. The signal is forwarded to amplifier 302. Because diodes 306, 308 are biased and amplifier 302 operates in a differential mode, the DC voltages of diodes 306, 308 are cancelled out, resulting in amplifier 302 amplifying the signal. This aspect improves the temperature performance of circuit 300.

The amplified signal is passed from amplifier 302 to amplifier 304. Control line 332 is operative to control the operation of MOSFET 330. Control line 332 can be a digital (high/low) signal used to turn MOSFET 330 on (conducting) or off (cut-off). When MOSFET 330 is conducting, resistor 328 is shorted out, thus the only resistance between source 334 and the second (−) input of amplifier 304 is resistor 326. When MOSFET 330 is in cut-off, the resistance between the second input (−) of amplifier 304 and source 334 is resistor 326 and resistor 328. The resistance between the second input (−) of amplifier 304 and source 334 controls the gain of amplifier 304, thus, turning MOSFET 330 on or off changes the gain of amplifier from a high gain state (MOSFET 330 on) to a low gain state (MOSFET 330 off).

For transmitter power detection, control line 322 can be coupled to logic that determines the desired output power level of the transmitter (not shown), thus enabling a digital signal to be sent on control line 322 to set amplifier 304 in a high gain state or a low gain state. Amplifier 304 amplifies the amplified signal a second time. The twice amplified signal is then output from amplifier 304. For transmit output power detection, the twice amplified signal from amplifier 304 can be coupled to an analog to digital converter (ADC) 336. In a preferred embodiment, the gain of amplifier 302 is approximately between 1 and 2, preferably unity (1); and the gain of amplifier 304 in the low gain state is approximately between 1 and 4, preferably 1.3; and the gain of amplifier 304 in the high gain state approximately 4-10, preferably 5.5.

Those skilled in the art can readily appreciate that the gain of amplifier 304 can be further controlled by employing additional resistors between the second input (−) of amplifier 304 and source 334. Additional controllable switching devices are coupled in parallel with the resistors to force current through the resistors or to short them out.

Figure 4:
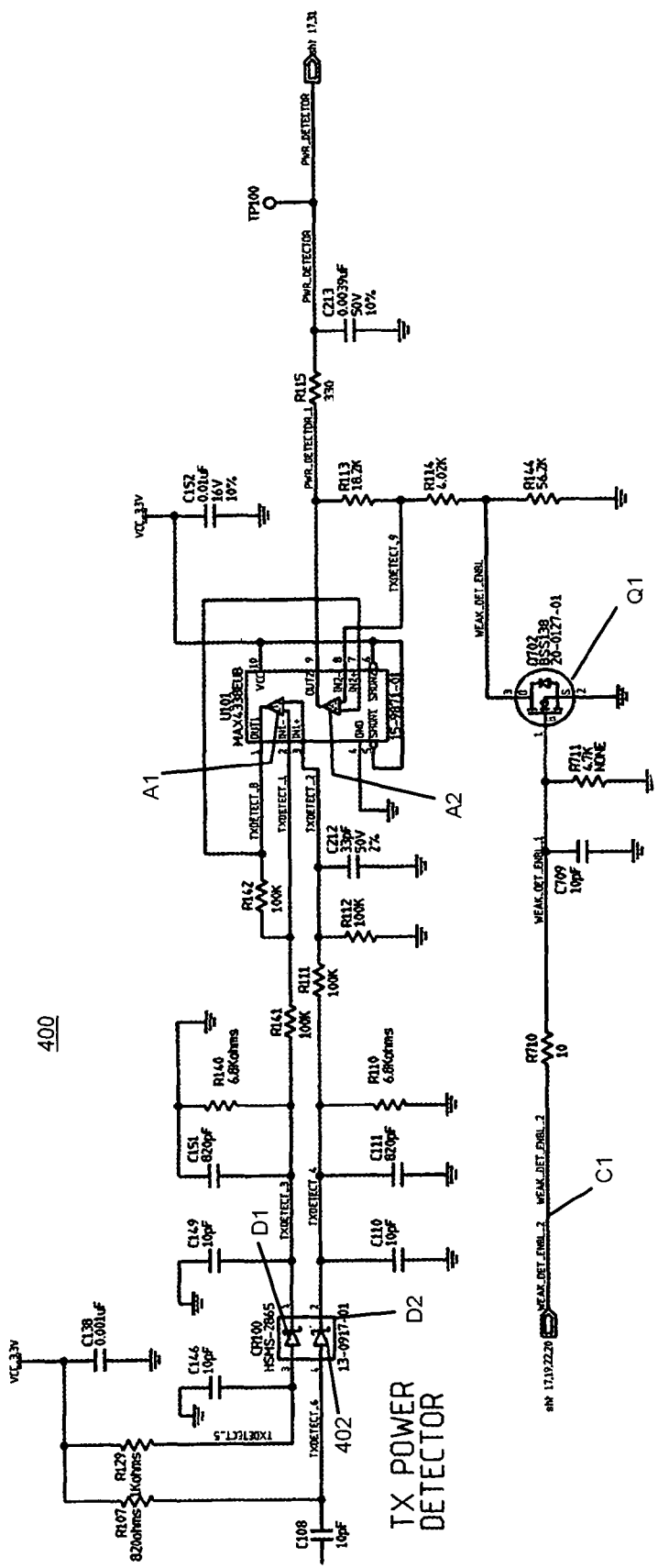
FIG. 4 is a detailed schematic diagram of a power detection circuit in accordance with an aspect of the present invention.

FIG. 4 is a detailed schematic diagram of a power detection circuit 400 in accordance with an aspect of the present invention. A detector 402 comprises diodes D1, D2. Diode D1 is biased via resistor R129 from a source VCC. Diode D2 is biased via resistor R107 from source VCC. The values of R107 and R129 may be varied to compensate for a single power supply providing VCC for circuit 400. Capacitor C130 filters VCC. Capacitors C146, C149, C151 and resistor R140 filter the signal from D1. Capacitors C110, C111 and resistors R110, R112 filter the signal from D2. Capacitor C212 takes care of latency between signals between D1 and D2. Resistor R142 is a feedback resistor for amplifier A1.

Amplifiers A1, A2 receive power from VCC that is filtered by capacitor C152. Amplifiers A1 and A2 are operational amplifiers. The output of amplifier A1 is connected to a first input (+) of amplifier A2. A feedback resistor R113 coupled the output of amplifier A2 with the second input (−) of amplifier A2. The second input (−) of amplifier A2 is coupled to a constant voltage (ground) through resistors R114 and R144. A MOSFET Q1 is coupled in parallel across resistor R144. A control signal is coupled to the gate of Q1 by control line C1 and is filtered by R710, C709 and R711. The output of amplifier A2 is filtered by R115 and C213.

In operation, the signal from diode D1 is forward to a first input (−) of amplifier A1 through resistor R141. The signal from diode D2 is forwarded to a second input (+) of amplifier A1 through resistor R111. The signal from D2 comprises the bias from VCC as well as a signal received across capacitor C108. Because A1 is an operational amplifier with differential inputs, the bias components of D1, D2 are removed and the signal received through capacitor C108 is amplified by amplifier A1. The biasing of diodes D1, D2 improves the temperature performance of circuit 400. The signal amplified by A1 is then forwarded to the first input (−) of A2. The gain of A2 is controlled by the signal on C1. In one mode, C1 turns Q1 on, effectively shorting out R144, thus the resistance between ground and the second (+) input of A2 is R114. In another mode, C1 turns Q1 off, making the resistance between the second input (−) of A2 and ground R114 plus R144. In a preferred mode, the gain of the first stage A1 is approximately 1 and the second stage A2 is 1.3 (low gain mode) and 5.5 (high gain mode); however the range for low gain amplifier A1 is 1 to 2, he low gain range of A2 is 1-4 and the high gain range of A2 is 4-10.

Although the above description illustrates an embodiment that employs two cascaded stages to select between a high and low gain, those skilled in the art can readily appreciate that aspects of the present invention can be extended to create multiple gain factor values. For example, referring to the embodiment described in FIG. 3, two controllable switching devices (e.g. transistors, MOSFETS, etc.) or a DAC with a resistor network can be employed to select more than two gain values. Consequently, improved accuracy for even lower levels, such as −10 dBm may be possible.

Figure 5:
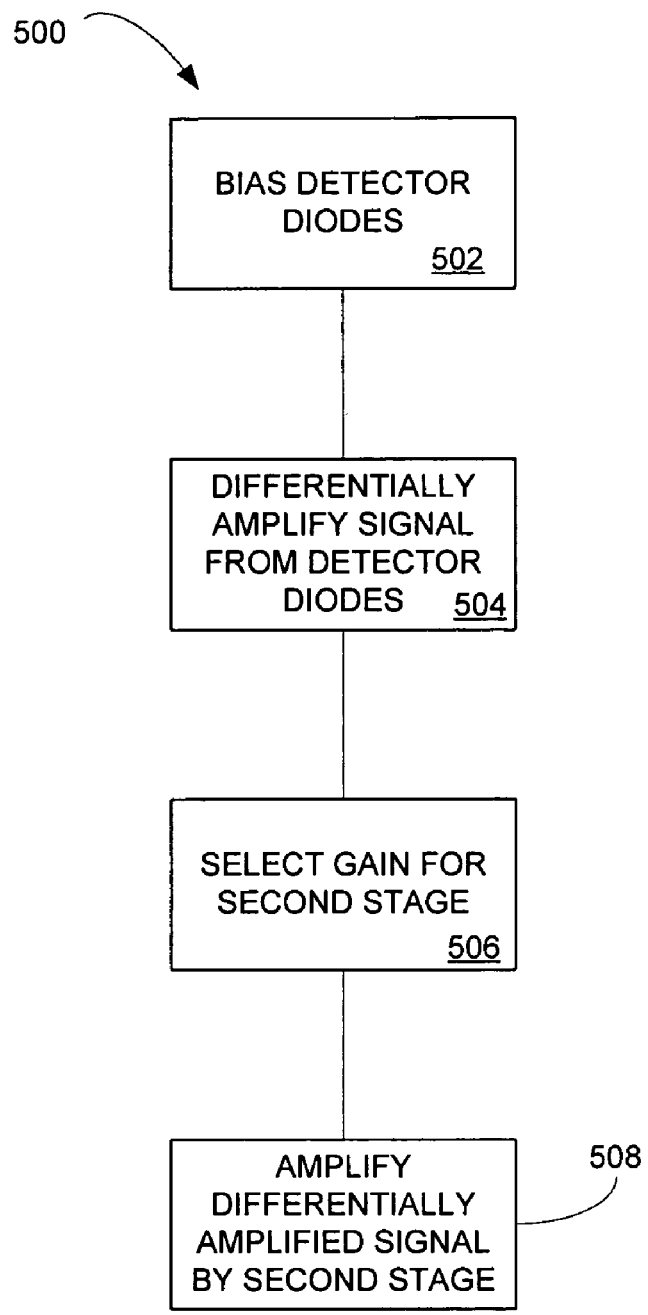
FIG. 5 is a block diagram of a methodology in accordance with an aspect of the present invention.

In view of the foregoing structural and functional features described above, a methodology in accordance with various aspects of the present invention will be better appreciated with reference to FIG. 5. While, for purposes of simplicity of explanation, the methodology of FIG. 5 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 5 is a block diagram of a methodology 500 in accordance with an aspect of the present invention. An aspect of methodology 500 is increasing the accuracy of power detection.

At 502, detector diodes are biased. The detector diodes can be biased at the same setting or there may be an offset to compensate for environmental factors such as temperature.

At 504, the signals from the detector diodes are differentially amplified. One of the detector diodes is receiving a signal that has a signal strength (or power level). If the diodes are biased substantially the same, then the differential amplification of diodes will result in only the signal being amplified as the bias signals will be cancelled out by the differential amplification. This improves the temperature response of the circuit. Preferably, the amplification has a unity gain, however a range of approximately 1-4 is suitable.

At 506, the gain for the second stage is selected. The gain for the second stage is selected based on the signal strength (power level) of the received signal. If the signal strength/power is low, then a high gain for the second stage amplifier is selected. If the signal strength/power is high, then a low gain is selected for the second stage amplifier. By high gain is meant 4-10. By low gain is meant 1-4. In a preferred embodiment the high gain is 5.5 and the low gain is 1.3.

At 508, the differentially amplified signal is then amplified by the second stage. The second stage amplifies the signal using the gain selected at 506. Optionally, the amplified signal from the second stage can be input into a A/D converter to convert the amplified signal to a digital signal.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims interpreted in accordance with the breadth to which they are fairly, legally and equitably entitled.

The invention claimed is:

1. A circuit, comprising:
   a first amplifier comprising an input and an output, the input of the first amplifier being configured to receive a signal;
   a second amplifier comprising an input and an output, the input of the second amplifier being coupled with the output of the first amplifier; and
   a gain adjustment circuit coupled with the second amplifier and being operable to configure the second amplifier to operate in one of a low gain state and a high gain state;
   wherein the gain adjustment circuit is configured to receive a gain selection signal generated by associated logic that determines a power level of the signal directly sensed at the input of the first amplifier for selecting whether the second amplifier operates in one of the low gain state and the high gain state.

2. A circuit according to claim 1, the gain adjustment circuit further comprising:
   a first and a second resistance in series; and
   a controllable switching device coupled in parallel to the second resistance;
   wherein the controllable switching device is operable in an on state and an off state;
   wherein the controllable switching device is a short circuit across the second resistance when in the on state; and
   wherein the controllable switching device is an open circuit across the second resistance when in the off state.

3. A circuit according to claim 1, wherein the gain for the second amplifier in the low gain state is approximately 1.3 and the gain in the high gain state is approximately 5.5.

4. A circuit according to claim 1, further comprising a detector circuit, the detector comprising a diode, the diode comprising an input and an output, wherein the output of the diode is coupled to the input of the first amplifier.

5. A circuit according to claim 4, further comprising
   the first amplifier is a differential amplifier further comprising a second input;
   the detector further comprising a second diode, the second diode comprising an input and an output;
   wherein the output of the second diode is coupled to the second input of the first amplifier; and
   wherein the differential amplifier amplifies the difference between the first input and the second input.

6. A circuit according to claim 1 further comprising an analog to digital converter coupled to the output of the second amplifier.

7. A circuit according to claim 1, wherein the gain of the second amplifier in the low gain state ranges from 1-4 and the gain in the high gain state ranges from 4-10.

8. A circuit, comprising:
   a first means for amplifying a signal, the first means having an input configured to receive the signal and an output;
   a second means for amplifying having an input and an output, the input of the second means for amplifying coupled in series to the output of the first means for amplifying; and a means for selecting gain, coupled to the second means for amplifying, for selecting one of a low gain mode and a high gain mode for the second means for amplifying;

wherein the means for selecting gain is configured to receive a gain selection signal generated by associated logic that determines a power level of the signal directly sensed at the input of the first means for amplifying for selecting whether the second means for amplifying operates in one of the low gain mode and the high gain mode.

9. A circuit according to claim 8, the means for selecting gain further comprising:

a first and a second means for resistance coupled in series; and means for controllable switching coupled in parallel to the second resistance means;

wherein the means for controllable switching is operable in an on state and an off state;

wherein the means for controllable switching device is a short circuit across the second resistance means in the on state; and wherein the means for controllable switching is an open circuit across the second means for resistance in the off state.

10. A circuit according to claim 8, further comprising a means for detection of a signal coupled to the first means for amplifying.

11. A circuit according to claim 10, further comprising the first means for amplifying is a means for differential amplifying further comprising a second input;

the means for detecting further comprising a means for biasing having an output;

wherein the means for detection is coupled to the first input of the means for differential amplifying; and wherein the output of the means for biasing is coupled to the second input of the first amplifier.

12. A circuit according to claim 11 further comprising means for analog to digital conversion coupled to the output of the second amplifier.

13. A circuit comprising:

a first amplifier comprising an input and an output, the input of the first amplifier being configured to receive a signal;

logic that determines a power level of the signal directly sensed at the input of the first amplifier and for generating a gain selection signal based on the determined power level;

a second amplifier comprising an input and an output, the input of the second amplifier being coupled with the output of the first amplifier;

a gain adjustment circuit coupled with the second amplifier and being operable to configure the second amplifier to operate in one of a group consisting of a low gain state and a high gain state;

wherein the gain adjustment circuit is configured to receive the gain selection signal for selecting whether the second amplifier operates in one of the group consisting of the low gain state and the high gain state.

\* \* \* \* \*